(12) United States Patent
Miura et al.

(10) Patent No.: US 10,420,252 B2
(45) Date of Patent: Sep. 17, 2019

(54) ELECTRONIC APPARATUS

(71) Applicants: Murata Manufacturing Co., Ltd., Kyoto (JP); National University Corporation Chiba University, Chiba (JP)

(72) Inventors: Tadamasa Miura, Kyoto (JP); Yoshiyuki Yamashita, Kyoto (JP); Hironao Ogura, Chiba (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 441 days.

(21) Appl. No.: 15/163,222

(22) Filed: May 24, 2016

(65) Prior Publication Data
US 2016/0270252 A1  Sep. 15, 2016

Related U.S. Application Data

(63) Continuation of application No. PCT/JP2014/073905, filed on Sep. 10, 2014.

(30) Foreign Application Priority Data

Nov. 26, 2013  (JP) .................................. 2013-244198

(51) Int. Cl.
H05K 7/20 (2006.01)
F28D 20/00 (2006.01)
H01L 23/427 (2006.01)

(52) U.S. Cl.
CPC ......... *H05K 7/2029* (2013.01); *F28D 20/003* (2013.01); *H01L 23/427* (2013.01);
(Continued)

(58) Field of Classification Search
CPC ............. H05K 7/2029; H05K 7/20318; H05K 7/20309; F28D 20/003; H01L 23/427; H01L 2924/0002; Y02E 60/142
See application file for complete search history.

(56) References Cited

U.S. PATENT DOCUMENTS 8,587,945 B1 * 11/2013 Hartmann .......... H05K 7/20454
                                                      361/679.53
2011/0056650 A1 * 3/2011 Ito ........................ F28D 15/00
                                                      165/67
(Continued)

FOREIGN PATENT DOCUMENTS

JP       58-000090 A     1/1983
JP       11-111898 A     4/1999
(Continued)

OTHER PUBLICATIONS

Written Opinion issued in Application No. PCT/JP2013/070478 dated Dec. 9, 2014.
(Continued)

*Primary Examiner* — Anthony M Haughton
*Assistant Examiner* — Yahya Ahmad
(74) *Attorney, Agent, or Firm* — Pearne & Gordon LLP (57) ABSTRACT

Provided is an electronic apparatus that makes it possible to improve a heat transfer property from a heat generating element to a heat storage material. The electronic apparatus is provided with a heat generating element and a heat storage device for storing heat generated by the heat generating element. The heat storage device includes a reaction chamber containing a heat storage material for absorbing the heat generated by the heat generating element. The reaction chamber is defined by a first surface, a second surface opposed to the first surface, and a plurality of side surfaces connecting the first surface with the second surface. In the reaction chamber, a thermal conductivity of a peripheral part is smaller than a thermal conductivity of a central part of the reaction chamber.

7 Claims, 7 Drawing Sheets

(52) U.S. Cl.
CPC ..... *H05K 7/20309* (2013.01); *H05K 7/20318* (2013.01); *H01L 2924/0002* (2013.01); *Y02E 60/142* (2013.01)

(56) References Cited

U.S. PATENT DOCUMENTS

| | | | | |
|---|---|---|---|---|
| 2012/0279679 | A1* | 11/2012 | Soukhojak | B60H 1/00492 165/10 |
| 2014/0124158 | A1* | 5/2014 | Yamashita | F25D 11/006 165/10 |
| 2014/0305142 | A1* | 10/2014 | Aman | F25D 5/00 62/4 |
| 2015/0144295 | A1* | 5/2015 | Miura | F25B 17/08 165/10 |
| 2018/0307122 | A1* | 10/2018 | Sugiyama | F28D 20/02 |
| 2018/0316837 | A1* | 11/2018 | Ishida | H01M 10/613 |

FOREIGN PATENT DOCUMENTS

| | | |
|---|---|---|
| JP | 11-222898 A | 4/1999 |
| JP | 2008-041762 A | 2/2008 |
| JP | 2008-111592 A | 5/2008 |
| JP | 2011-054883 A | 3/2011 |
| JP | 2011054883 A | 3/2011 |

OTHER PUBLICATIONS

International Search Report issued in Application No. PCT/JP2013/070478 dated Dec. 9, 2014.

* cited by examiner

ELECTRONIC APPARATUS

TECHNICAL FIELD

The present disclosure relates to an electronic apparatus and more particularly to an electronic apparatus including a heat generating element (or a heat generating electronic component).

BACKGROUND ART

Recent improvements in performance of electronic apparatuses have led to an increase in the number of heat generating elements built into one electronic apparatus as well as an increase in energy amount input to each of the heat generating elements, resulting in an increase in an amount of the heat generated in the electronic apparatuses.

A conventional heat dissipation method using a cooling fan requires additional energy for driving the cooling fan and therefore is not preferable because power consumption of an electronic apparatus increases so as to acquire higher heat dissipation performance. Moreover, this method is not efficient since the heat generated due to energy loss is dissipated by energy input. Additionally, the cooling fan requires a comparatively large space and is not suitable for small electronic apparatuses. Moreover, in electronic apparatuses such as smartphones and tablet-type devices that include a sealed housing, a current of air by the cooling fan cannot be formed and exhausted to the outside.

A conventional heat dissipation method using a heat pipe can quickly transport heat. However, a heat sink or a radiator plate is required for dissipating the heat, which require a comparatively large space and are not suitable for small electronic apparatuses. In some examples, the heat may be released to a housing of an electronic apparatus instead of a heat sink. However, the housings in electronic apparatuses have been reduced in surface area due to reductions in size and thickness of the electronic apparatuses and cannot provide high heat dissipation performance. Moreover, life shortening of a lithium-ion battery is a problem for high-performance mobile apparatuses such as smartphones and the release of heat to the housing increases an environment temperature in use of the lithium-ion battery and may result in decrease in battery capacity with the passage of time.

In some examples, temperatures of the individual heat generating elements are measured, and an energy amount input to the heat generating element(s) is limited when the measured temperature value(s) exceeds a predetermined threshold value. This method is intended to reduce the amount of heat generated by the heat generating element(s) and thereby suppress a rise in the temperature of the heat generating element(s). However, since the function of the heat generating elements (e.g., CPU performance) is impaired each time the temperature of the heat generating elements rises, this method sacrifices the performance of the heat generating elements.

CITATION LIST

Patent Literature

Patent Literature 1: JP 2008-111592 A

SUMMARY

Technical Problem

As described in Patent Literature 1, chemical heat pumps are currently used for the purpose of utilization of exhausted heat in chemical plants and electric power stations and are also used in household hot-water-supply/heating systems and large-sized equipment such as freezer cars. Moreover, Japanese Patent Application No. 2012-173042 describes an electronic apparatus based on an original idea of using a chemical heat pump as a new means being able to suppress a rise in temperature of a heat generating element.

This electronic apparatus comprises a heat generating element and a heat storage device including a reaction chamber containing a chemical heat storage material showing an endothermic reaction in response to heat generated by the heat generating element. The heat storage device further includes a condensation/evaporation chamber for condensing or evaporating a condensable component produced from the endothermic reaction of the chemical heat storage material. The heat storage device further includes a communication part communicating the reaction chamber with the condensation/evaporation chamber such that the condensable component is movable between the reaction chamber and the condensation/evaporation chamber through the communication part. The heat storage device includes the chemical heat pump.

According to this electronic apparatus, the electronic apparatus including the heat generating element applies thereto the heat storage device and uses the chemical heat storage material showing an endothermic reaction in response to heat generated by the heat generating element. When the heat generating element generates heat, the chemical heat storage material causes a reaction to take and store heat from the heat generating element, so that a rise in temperature of the heat generating element can be suppressed.

Since a thermal conductivity of a heat storage material contained in a reaction chamber is generally smaller than a thermal conductivity of a member making up the reaction chamber, heat transfer from the heat generating element to the heat storage material must efficiently be performed so as to efficiently store the heat generated by the heat generating element in the heat storage material.

It is therefore an object of the present disclosure to provide an electronic apparatus capable of improving a heat transfer property from a heat generating element to a heat storage material.

Solution to Problem

A first embodiment provides an electronic apparatus comprising: a heat generating element; and a heat storage device for storing heat generated by the heat generating element. The heat storage device comprises a reaction chamber containing a heat storage material for absorbing the heat generated by the heat generating element. The reaction chamber is defined by a first surface, a second surface opposed to the first surface, and a plurality of side surfaces connecting the first surface with the second surface. In the reaction chamber, a thermal conductivity of a peripheral part of the reaction chamber is smaller than a thermal conductivity of a central part of the reaction chamber.

According to the above-described configuration, the heat transfer from the heat storage material to the reaction chamber can be suppressed and, as a result, the heat transfer property from the heat generating element to the heat storage material can be improved.

The heat generating element may be selected, for example, from the group consisting of, but not limited to, integrated circuits, light-emitting elements, field effect transistors, motors, coils, converters, inverters, and capacitors.

The heat storage material includes a chemical heat storage material showing an endothermic reaction through a chemical reaction and an adsorption/absorption heat storage material showing an endothermic reaction through an adsorption or absorption reaction. For example, the chemical heat storage material may include hydrate(s) such as calcium sulfate and calcium chloride, hydroxide(s) of calcium or magnesium, etc. For example, the adsorption/absorption heat storage material may include zeolite, silica gel, mesoporous silica, activated carbon, etc. However, the heat storage material may be any material being able to absorb the heat generated by the heat generating element without being limited to the above examples, and any suitable heat storage materials are usable.

In a case where the heat storage material is hydrate, hydroxide, zeolite, etc. as described above, a condensable component can be water. However, the condensable component is not limited to water depending on the heat storage material.

The condensable component is not limited to water and may be any component capable of liquid-vapor transformation such as ammonium, or particularly any component capable of changing to the both states in usage environment.

The above-described first embodiment further includes the following configurations.

(1) A gap is formed between the inner side surface of the reaction chamber and the heat storage material.

(2) In the configuration (1), the reaction chamber has a generally (or substantially) rectangular parallelepiped shape formed by the first surface, the second surface, and the plurality of the side surfaces; the heat storage material has a first surface located at a side of (or in a vicinity of, or adjacent to) the first surface of the reaction chamber and has a tapered shape from the first surface of the heat storage material toward the second surface of the reaction chamber. A shape of the first surface of the heat storage material is generally (or substantially) the same as or smaller than a shape of the first surface of the reaction chamber.

(3) In the configuration (1) or (2), the reaction chamber is provided with a positioning member for positioning the heat storage material.

(4) The heat storage material has a peripheral member located in the peripheral part and a central member located in the central part. The peripheral member has a thermal conductivity smaller than a thermal conductivity of the central member (5) In the configuration (4), the peripheral member is made of a mixture material of a base material and resin beads, and the heat storage material is formed by press forming of the central member and the peripheral member followed by heat treatment.

According to the configuration (1), the heat transfer from the heat storage material to the reaction chamber can be suppressed by the gap between the inner side surface of the reaction chamber and the heat storage material and, as a result, the heat transfer property from the heat generating element to the heat storage material can be improved.

According to the configuration (2), the gap between the inner side surface of the reaction chamber and the heat storage material can be formed simply by containing (or housing) the heat storage material into the reaction chamber.

According to the configuration (3), since the heat storage material can be positioned by the positioning member, the gap between the inner side surface of the reaction chamber and the heat storage material can be formed by containing (or housing) the heat storage material into the reaction chamber.

According to the configuration (4), since the thermal conductivity of the peripheral member of the heat storage material is smaller than the thermal conductivity of the central member, the heat transfer from the heat storage material to the reaction chamber can be suppressed and, as a result, the heat transfer property from the heat generating element to the heat storage material can be improved.

According to the configuration (5), the heat storage material can be readily formed that has the thermal conductivity of the peripheral member smaller than thermal conductivity of the central member.

A second embodiment provides an electronic apparatus comprising a heat generating element and a heat storage device for storing heat generated by the heat generating element. The heat storage device comprises a reaction chamber containing a heat storage material for absorbing the heat generated by the heat generating element. The reaction chamber is formed (i.e., defined) by a first surface, a second surface opposed to the first surface, and a plurality of side surfaces connecting the first surface with the second surface. The first surface has a convexo-concave structure formed on an inner surface thereof.

According to the above-described configuration, the reaction chamber has the convexo-concave structure formed on the first surface at the side of the heat generating element. Therefore, a contact area can be increased between the first surface and the heat storage material and, as a result, the heat transfer property from the heat generating element to the heat storage material can be improved.

Advantageous Effects

In short, the present disclosure can provide the electronic apparatus capable of improving the heat transfer property from the heat generating element to the heat storage material.

DESCRIPTION OF EMBODIMENTS

An electronic apparatus according to an embodiment of the present disclosure will be described in detail below with reference to the drawings. However, the present disclosure is not limited thereto.

(Overall Configuration of Electronic Apparatus)

Figure 1:
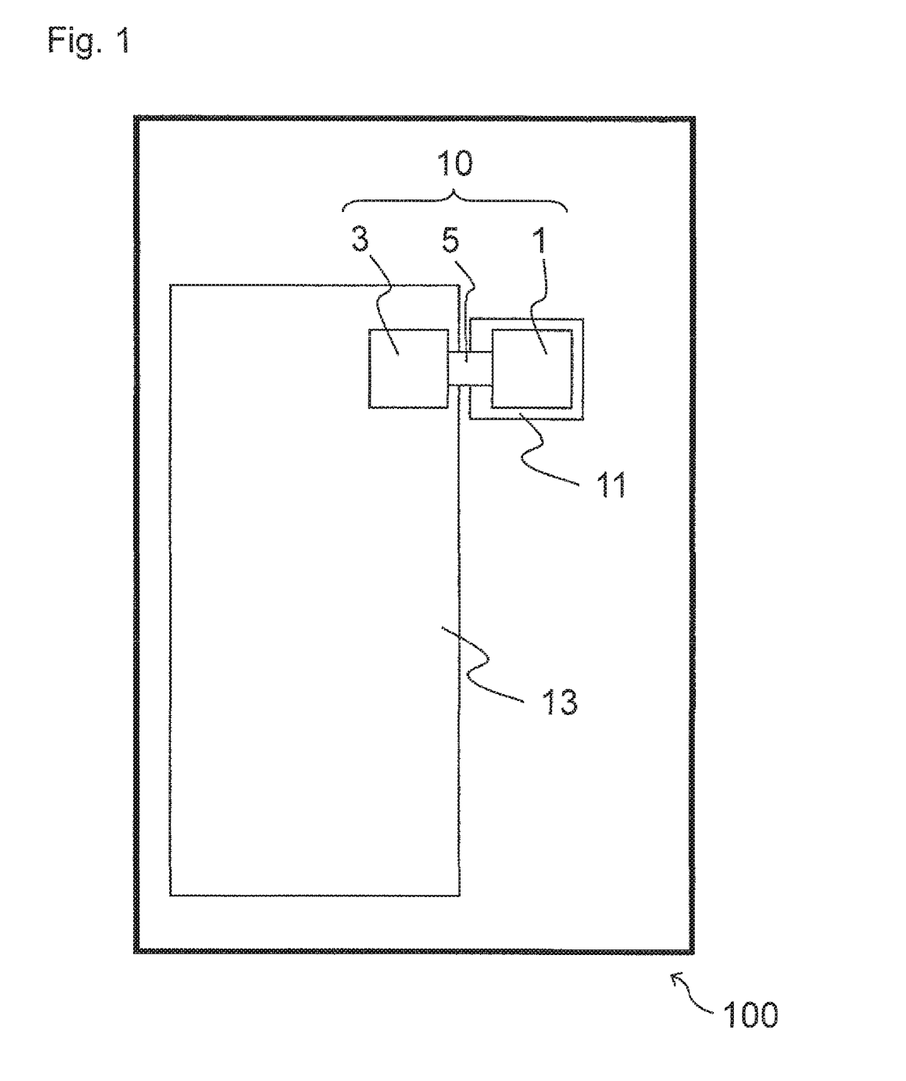
FIG. 1 is a schematic top view of an electronic apparatus according to one embodiment.

FIG. 1 is a schematic top view of an electronic apparatus 100 according to an embodiment of the present disclosure. As shown in FIG. 1, the electronic apparatus 100 includes a heat generating element 11 and a heat storage device 10 for storing heat generated by the heat generating element 11. If the electronic apparatus 100 is a smartphone, the heat generating element 11 can be, for example, a power management IC. The electronic apparatus 100 further includes a lithium-ion battery 13 as a heat conductive member.

The heat storage device 10 includes a reaction chamber 1 containing (or housing) a heat storage material for absorbing the heat generated by the heat generating element 11, a condensation/evaporation chamber 3 for condensing or evaporating a condensable component produced due to heat absorption by the heat storage material, and a communication part 5 communicating the reaction chamber 1 with the condensation/evaporation chamber 3 such that the condensable component is movable between the reaction chamber 1 and the condensation/evaporation chamber 3 through the communication part 5. The reaction chamber 1 is thermally coupled to the heat generating element 11. The condensation/evaporation chamber 3 is thermally coupled to the lithium-ion battery 13. A method of thermal coupling may be, but not limited to, a method using an adhesive of which heat conductivity is improved by a metal filler, for example.

In this embodiment, when the power management IC as the heat generating element 11 operates to generate heat and reaches a certain high temperature (determined depending on the heat storage material used), an endothermic reaction of the heat storage material proceeds in the reaction chamber 1 by taking the heat from the heat generating element 11, and a condensable component generated by this endothermic reaction is condensed in the condensation/evaporation chamber 3 to give heat to the lithium-ion battery 13, thereby reducing a rise in temperature of the heat generating element 11 and possibly stabilizing the temperature of the heat generating element 11, so that the heat generating element 11 can be maintained at a heatproof temperature or less (e.g., 85° C. or less). Subsequently, when the operation of the heat generating element 11 is changed to a lower level or stopped and the temperature of the heat generating element 11 is lowered to a certain low temperature, an exothermic reaction of the heat storage material proceeds in the reaction chamber 1 while the condensable component takes heat from the lithium-ion battery 13 and evaporates in the condensation/evaporation chamber 3. As a result, the temperature of the heat generating element 11 slightly rises while the temperature of the lithium-ion battery 13 decreases so that the lithium-ion battery 13 can be maintained at a temperature (e.g., 40° C. or less) not posing a problem of life shortening. As such, the heat storage device 10 is configured to take heat from the heat generating element 11 and release the heat to the lithium-ion battery 13 when the heat generating element 11 operates at a high temperature, and to give heat to the heat generating element 11 and take heat from (cool) the lithium-ion battery 13 when the heat generating element 11 operates at a low temperature.

(Configuration of Heat Storage Device)

Figure 2:
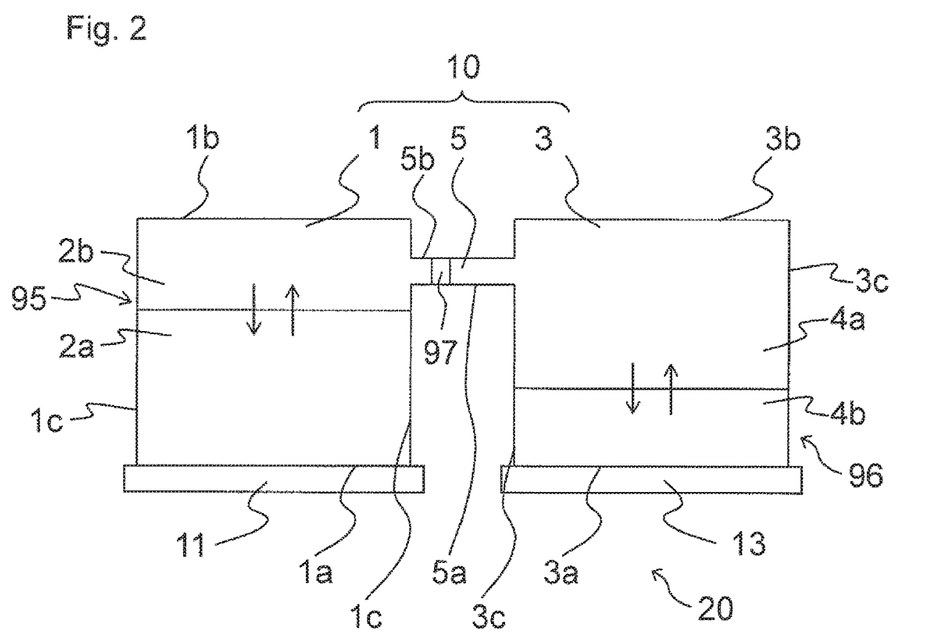
FIG. 2 is a schematic cross-sectional view of a part as a heat storage device 10.

FIG. 2 is a schematic cross-sectional view of the heat storage device 10 as a part of the electronic apparatus. A heat storage material 95 is contained (or housed) in the reaction chamber 1. The heat storage material 95 may comprise, for example, a solid phase 2a. A gas phase 2b including a condensable component may be present in the reaction chamber 1. The pressure in the reaction chamber 1 is desirably substantially equal to an equilibrium pressure between the endothermic reaction and the exothermic reaction under normal usage temperature environment (wherein the heat generating element 11 is in a non-heat-generating state).

The condensable component may be included in a gas phase 4a and a liquid phase 4b and present in the condensation/evaporation chamber 3. Although not limiting this embodiment, a preliminarily condensed component (e.g., water in a liquid state) may be housed in the condensation/evaporation chamber. The pressure in the condensation/evaporation chamber 3 is desirably substantially equal to a saturated vapor pressure of the condensable component (e.g., a saturated water vapor pressure in the case of water) under usage temperature environment. The condensation/evaporation chamber 3 is provided with a trap member 96 for trapping the condensable component.

The trap member 96 may be a member reversibly trapping liquid. More specifically, the trap member 96 can be made up of, but not limited to, a porous material, for example, a porous material made of ceramics, zeolite, metal, etc.

A communication part 5 communicating the reaction chamber 1 with the condensation/evaporation chamber 3 may be configured such that the condensable component is movable between the chambers. More specifically, the condensable component may move in a gas state and, in this case, the communication part 5 may be a part through which a gas may pass. This communication part may comprise, but is not limited to, a tubular member. The communication part 5 is provided with a filter member 97 allowing passage of gas substantially without allowing passage of solid and liquid.

The filter member 97 may be any member allowing passage of gas substantially without allowing passage of solid and liquid. "Substantially without allowing passage of solid and liquid" means that the member may allow passage of a small amount of solid and liquid to the extent not impairing the performance of the chemical heat pump. The filter member 97 may not allow passage of solid and may also not allow passage of both solid and liquid.

More specifically, the filter member 97 may have moisture permeability (JIS L1099 (Method B; typically, Method B-1)) of 1000 $g/m^2/24$ h or more. The filter member 97 may alternatively have a moisture permeability of 10000 $g/m^2/24$ h or more. This can make a pressure loss attributable to the filter member 97 sufficiently small. The impermeability of solid may be achieved such that the heat storage material does not pass through, and may appropriately be selected depending on dimensions of the heat storage material used. The impermeability of liquid may achieve water resistance (JIS L1092 (Method A)) of 1000 mm or more. Alternatively, the impermeability of liquid may achieve water resistance of, 10000 mm or more.

The filter member 97 can comprise, for example, a film (microporous filter) formed by stretching polytetrafluoroethylene, which may be compounded with polyurethane polymer as needed. Such a film is commercially available under the trade name of Gore-Tex®. Alternatively, the filter member 97 can comprise a water-repellent fabric cloth coated with polyurethane. Such polyurethane-coated cloth is commercially available under the trade name of Entrant GII® XT from Toray Industries, Inc.

However, without being limited by these examples, the filter member 97 can be any suitable structure having pores with a dimension smaller than associated water molecular clusters in a liquid state and larger than water molecules present independently in a water vapor state.

The communication part 5 may or may not include a valve (not shown). In a case where the communication part 5 is not provided with a valve, a device configuration is simplified and the movement of the condensable component and the behavior of the heat storage device 10 can be dependent on the progress of reaction in the reaction chamber 1 and/or the progress of phase change in the condensation/evaporation chamber 3 (in particular, the temperature in the reaction chamber 1 and/or the condensation/evaporation chamber 3). In a case where the communication part 5 is provided with a valve, the movement of the condensable component and the behavior of the heat storage device 10 can be controlled by opening/closing of the valve so that the timing of movement of heat, generation of heat, and cooling can be managed and a more elaborate thermal design inside the electronic apparatus can be achieved.

The heat storage device 10 is a closed system without entry and exit of a substance. Moreover, the heat storage device 10 is configured to enable heat to enter and exit at least the reaction chamber 1, and in some examples, the reaction chamber 1 and the condensation/evaporation chamber 3. The reaction chamber 1 and the condensation/evaporation chamber 3 can be at least partially made of a heat conductive material. The heat conductive material is not particularly limited and may be a good conductor of heat such as, for example, any one of metals (e.g., copper), oxides (e.g., alumina), nitrides (e.g., aluminum nitride), carbon, and so on.

The reaction chamber 1 is formed (i.e., defined) by a first surface 1a, a second surface 1b opposed to the first surface 1a, and four side surfaces 1c connecting the first surface 1a with the second surface 1b. The first surface 1a can be a side of the heat generating element 11 or the first surface 1a can be a surface that is in a vicinity of or adjacent to the heat generating element 11. The reaction chamber 1 has a generally rectangular parallelepiped shape.

Figure 3:
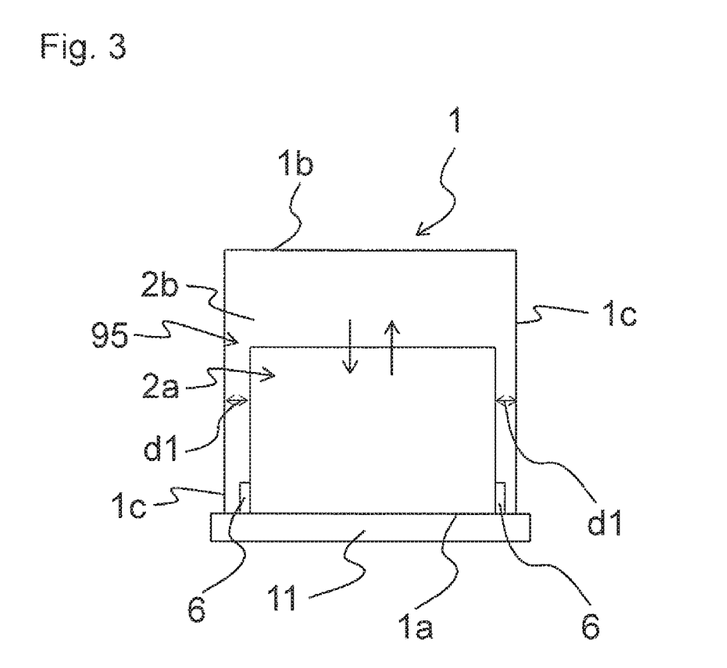
FIG. 3 is a schematic cross-sectional view of a part as a reaction chamber.

FIG. 3 is a schematic cross-sectional view of the reaction chamber 1 as a part of the electronic apparatus. As shown in FIG. 3, the first surface 1a of the reaction chamber 1 is provided with a positioning member 6 for positioning the heat storage material 95, and the heat storage material 95 is brought into contact with the first surface 1a and positioned on the first surface 1a. As a result, a predetermined gap d1 is formed between the heat storage material 95 and the side surfaces 1c. The gap portion has the thermal conductivity of air, which is smaller than the thermal conductivity of the heat storage material 95. Therefore, a thermal conductivity of a peripheral part of the reaction chamber 1 (e.g., the periphery of the side surfaces 1c) is smaller than a thermal conductivity of the heat storage material 95 located at a central part of the reaction chamber 1. The dimension of the gap d1 is about 0.1 mm.

(Method for Producing Heat Storage Device)

FIG. 4 is a schematic perspective view for explaining a method for producing the heat storage device 10. An example of the method of producing the heat storage device 10 will hereinafter be described with reference to FIG. 4.

Figure 4A:
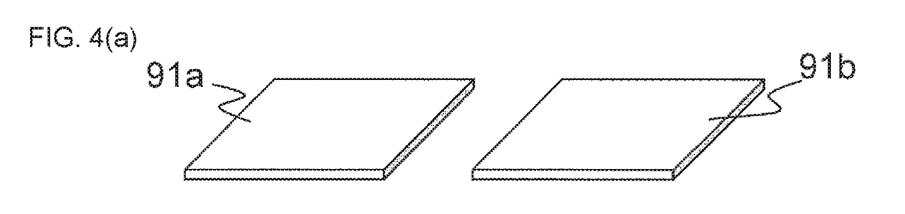
FIGS. 4(a)-4(d) are schematic perspective views for explaining a method for producing a heat storage device.

First, as shown in FIG. 4(a), two metal plates 91a, 91b are prepared. These metal plates 91a, 91b may be made of, but not limited to, anticorrosion metal (e.g., stainless steel). The thickness of the metal plates 91a, 91b can be, for example, 0.01 mm or more, for example, 0.05 to 1.0 mm. The metal plates 91a, 91b may be the same as or different from each other in terms of material and thickness.

Figure 4B:
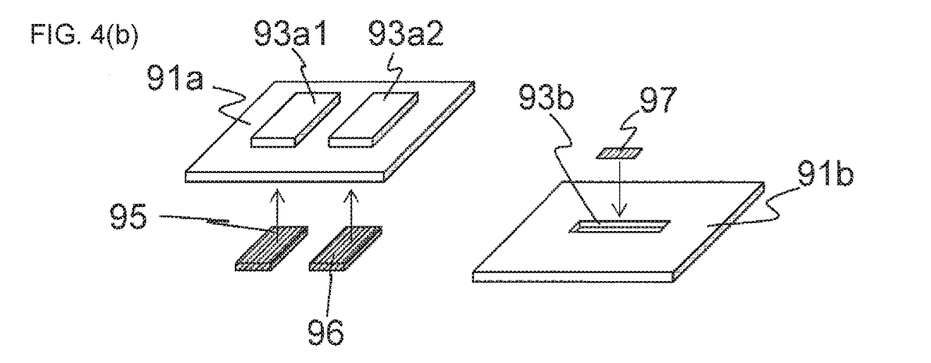

As shown in FIG. 4(b), two convex parts 93a1, 93a2 corresponding to the reaction chamber 1 and the condensation/evaporation chamber 3 are formed on the one metal plate 91a. The dimensions of the convex parts 93a1, 93a2 are appropriately determined depending on dimensions desired for the reaction chamber 1 and the condensation/evaporation chamber 3. The heights of the convex parts 93a1, 93a2 can be, for example, 0.1 to 10 mm, and more particularly, 0.3 to 1.0 mm and may be the same as or different from each other. On the other metal plate 91b, a concave part 93b corresponding to the communication part 5 will be formed. The dimensions of the concave part 93b may form the communication part 5 allowing communication between the reaction chamber 1 and the condensation/evaporation chamber 3 such that the condensable component may move therethrough. The depth of the concave part 93b can be, for example, 0.1 to 10 mm, and more particularly, 0.3 to 1.0 mm. The concave/convex shapes on the metal plates 91a, 91b may be formed using any suitable method such as, for example, raising and press forming.

The heat storage material 95 is then disposed on the convex part 93a1. The heat storage material 95 is typically a solid or in a solid state and has a shape of granules or a sheet, for example. The heat storage material 95 may be preliminarily formed as a shaped material (or compact). Specifically, the heat storage material 95 is a composite having a resin material such as epoxy, acrylic, polyimide, and/or polyethylene resin materials and is formed by a method such as press molding. Although the heat storage material 95 may be shaped or packed in advance as described above, this embodiment is not limited thereto.

The trap member 96 capable of trapping liquid is disposed on the convex part 93a2. The trap member 96 is made of a porous material, for example.

In the concave part 93b of the metal plate 91b, the filter member 97 is disposed that allows passage of gas substantially without allowing passage of solid and liquid.

Figure 4C:
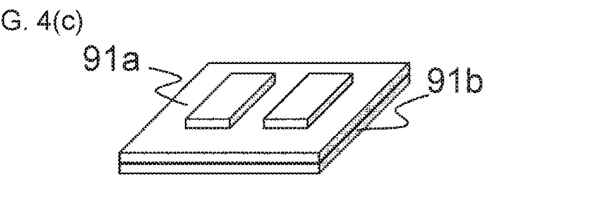

Subsequently, as shown in FIG. 4(c), the metal plates 91a, 91b are overlapped with each other such that the convex parts 93a and the concave part 93b form an internal space together. As a result, outer peripheral flat surfaces of the metal plates 91a, 91b come into close contact with each other.

Figure 4D:
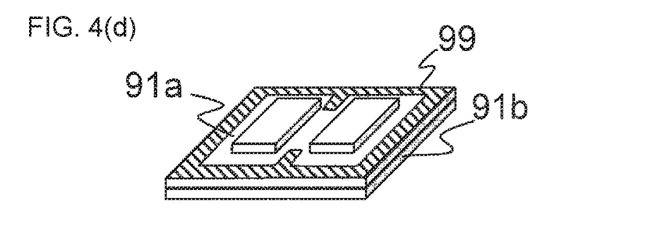

As shown in FIG. 4(d), outer peripheral parts 99 of the overlapped metal plates 91a, 91b are sealed airtight. The airtight sealing may be conducted at a pressure desired for the inside of the heat storage device 10 such as, for example, a reduced pressure of 0.1 Pa to 100 kPa, and more particularly 1.0 Pa to 10 kPa (absolute pressure). The pressure will depend on the heat storage material used. The airtight sealing may be achieved by applying any suitable method such as, for example, laser beam welding, arc welding, resistance welding, gas welding, and brazing can be used. After the airtight sealing, unnecessary edge parts of the outer peripheral parts may optionally be removed by punching etc.

The heat storage device 10 is produced as described above. However, the above production method is exemplarily described and the heat storage device according to the present disclosure may be produced by any suitable method.

The heat storage device 10 produced as described above is incorporated into the electronic apparatus 100.

The electronic apparatus 100 having the above configuration can provide the following effects.

(1) In the reaction chamber 1, the thermal conductivity of the peripheral part of the reaction chamber 1 (e.g., the periphery of the side surfaces 1c) is lower than the thermal conductivity of the central part of the reaction chamber 1. Therefore, the heat transfer from the heat storage material 95 to the reaction chamber 1 can be suppressed and, as a result, the heat transfer property from the heat generating element 11 to the heat storage material 95 can be improved.

(2) Since the gap d1 is formed between the side surfaces 1c of the reaction chamber 1 and the heat storage material 95, the heat transfer from the heat storage material 95 to the reaction chamber 1 can be suppressed by the gap d1 and, as a result, the heat transfer property from the heat generating element 11 to the heat storage material 95 can be improved. It is noted when the dimension of the gap d1 is 0.1 mm or more, the heat transfer from the heat storage material 95 to the reaction chamber 1 can be suppressed. However, as the dimension of the gap d1 is made larger, the heat storage material 95 contained in the reaction chamber 1 can become reduced in amount. Thus, in order to ensure that the total heat storage amount of the heat storage material 95 (i.e., the amount of the heat storage material 95) is high, the gap d1 may be formed of about 0.1 mm between the side surfaces 1c of the reaction chamber 1 and the heat storage material 95.

(3) Since the reaction chamber 1 is provided with the positioning member 6 for positioning the heat storage material 95, the gap d1 between the side surfaces 1c of the reaction chamber 1 and the heat storage material 95 can be formed simply by placing the heat storage material 95 into the reaction chamber 1.

(4) Since the trap member 96 is disposed in the condensation/evaporation chamber 3, even in such a case that the electronic apparatus 100 turns upward or downward and/or to the left or right, the condensable component (liquid) condensed in the condensation/evaporation chamber 3 can be prevented from moving from the condensation/evaporation chamber 3 through the communication part 5 to the reaction chamber 1.

(5) Since the communication part 5 is disposed with the filter member 97, even in such a case that the electronic apparatus 100 turns upward or downward and/or to the left or right, the heat storage material 95 in the reaction chamber 1 can be prevented from moving from the reaction chamber 1 through the communication part 5 to the condensation/evaporation chamber 3, and the condensable component (liquid) condensed in the condensation/evaporation chamber 3 can be prevented from moving from the condensation/evaporation chamber 3 through the communication part 5 to the reaction chamber 1.

(Modified Example 1 of Heat Storage Material)

Figure 5:
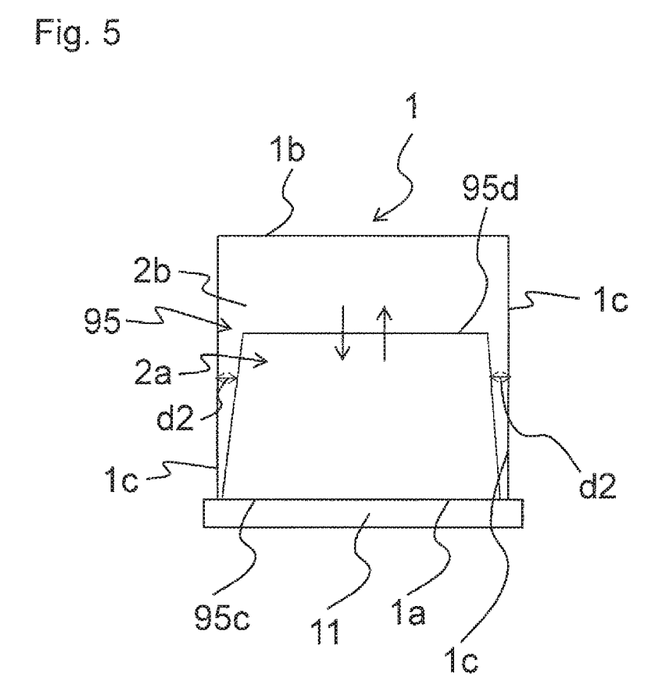
FIG. 5 is a schematic cross-sectional view of a part as the reaction chamber, showing a modified example of the heat storage material.

FIG. 5 is a schematic cross-sectional view of the reaction chamber 1 as a part of the electronic apparatus, and the heat storage material 95 is in a different form from FIG. 3. As shown in FIG. 5, the heat storage material 95 has a first surface 95c contacting with the first surface 1a of the reaction chamber 1. The heat storage material 95 further has a second surface 95d opposed to the first surface 95c at a side of the second surface 1b of the reaction chamber 1. An area of the first surface 95c is larger than an area of the second surface 95d. The heat storage material 95 has a frustum shape with one bottom surface defined by the first surface 95c and the other bottom surface defined by the second surface 95d. The shape of the first surface 95c of the heat storage material 95 is generally (or substantially) the same as or smaller than the shape of the first surface 1a of the reaction chamber 1 so that the heat storage material 95 can be contained (or housed) in the reaction chamber 1. As a result, a predetermined gap d2 is formed between the heat storage material 95 and the side surfaces 1c of the reaction chamber 1. The portion as the gap d2 has the thermal conductivity of air, which is smaller than the thermal conductivity of the heat storage material 95. Therefore, the thermal conductivity of the peripheral part in the periphery of the side surfaces 1c of the reaction chamber 1 is smaller than the thermal conductivity of the heat storage material 95 located at the central part of the reaction chamber 1.

According to the above-described configuration, the heat storage material 95 has a shape tapered from the first surface 95c of the heat storage material (and the first surface 1a of the reaction chamber 1) toward the second surface 1b of the reaction chamber 1, and the shape of the first surface 95c is generally the same as or smaller than the shape of the first surface 1a of the reaction chamber 1. Moreover, the reaction chamber 1 is formed (i.e., defined) by the first surface 1a, the second surface 1b, and the four side surfaces 1c and has a generally rectangular parallelepiped shape. As a result, the gap d2 between the side surfaces 1c of the reaction chamber 1 and the heat storage material 95 can be formed simply by containing the heat storage material 95 within the reaction chamber 1. Although the heat storage material 95 has the frustum shape defined by the first surface 95c and the second surface 95d in the above-described configuration, the heat storage material 95 may have a shape of a frustum (such as a frustum of pyramid and a frustum of cone) without the second surface 95d, as long as the shape is tapered from the first surface 95c of the heat storage material 95 toward the second surface 1b of the reaction chamber 1.

(Modified Example 2 of Heat Storage Material)

Figure 6:
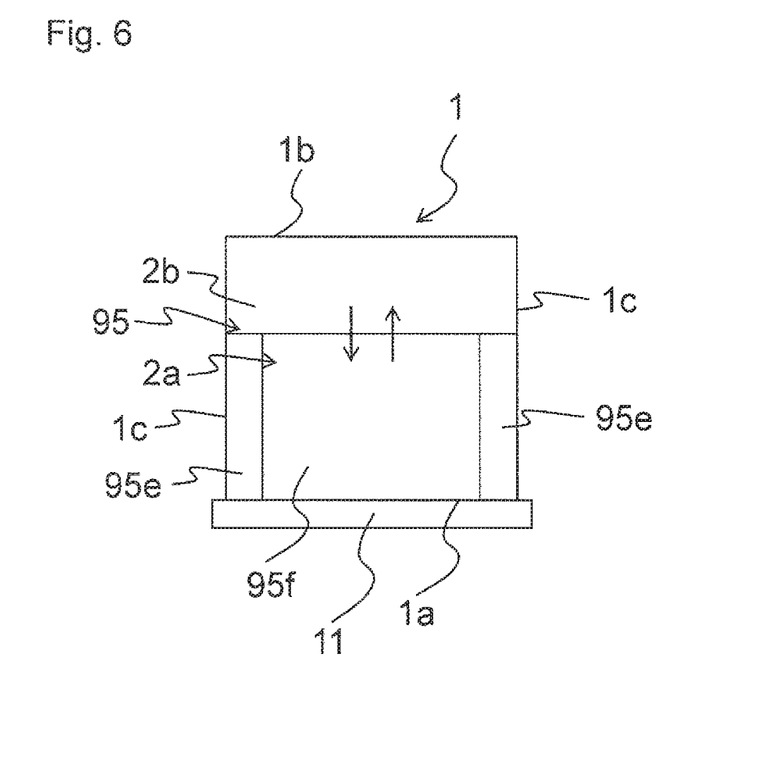
FIG. 6 is a schematic cross-sectional view of a part as the reaction chamber, showing a modified example of the heat storage material.

FIG. 6 is a schematic cross-sectional view of the reaction chamber 1 as a part of the electronic apparatus, and the heat storage material 95 is in a different form from FIGS. 3 and 5. As shown in FIG. 6, the heat storage material 95 includes two members 95e, 95f different in thermal conductivity such that a thermal conductivity of the peripheral member 95e located in the peripheral part of the reaction chamber 1 (e.g., the periphery of the side surfaces 1c) is smaller than a thermal conductivity of the central member 95f located in the central part of the reaction chamber 1.

(Method for Producing Heat Storage Material Including Two Members Different in Heat Conductivity)

An example method for producing the heat storage material 95 shown in FIG. 6 will be described below.

Firstly, a base material of a heat storage material (e.g., calcium sulfate, calcium chloride, zeolite, or a mixture of any two or more thereof) and resin beads (e.g., acrylic beads, urethane beads, cellulose beads, or a mixture of any two or more thereof) are weighed at the volume ratio of 1:1 and dry-blended. Subsequently, the blended material is mixed with an epoxy, acrylic, polyimide, or polyethylene resin material to obtain a first heat storage material.

Secondary, a base material of a heat storage material (e.g., calcium sulfate, calcium chloride, zeolite, or a mixture of any two or more thereof) is mixed with an epoxy, acrylic, polyimide, or polyethylene resin material to obtain a second heat storage material.

Then, the first heat storage material is doughnut-shaped by a method such as pressing with a doughnut-shaped die to form the peripheral member 95e. The second heat storage material is added into a center portion (i.e. a space portion) of the doughnut shape of the first heat storage material, and is shaped by a method such as pressing to form the central member 95f. As a result, a shaped material (or compact) is formed by the second heat storage material located in the central part and the first heat storage material located in the peripheral part.

The shaped material obtained in this way is then subjected to heat treatment. The heat treatment is performed under any suitable conditions in which resin beads such as acrylic beads evaporate, and may include, for example, two hours of heating at 260° C. The shaped material subjected to heat treatment under the conditions has holes (pores) formed in the peripheral part made of the first heat storage material due to evaporation of the acrylic beads etc. contained in the first heat storage material. As a result, the thermal conductivity of the peripheral part is reduced so as to produce a heat storage material having a thermal conductivity of the peripheral part smaller than a thermal conductivity of the central part.

The above-described configuration can provide the following effects.

(1) Since the thermal conductivity of the peripheral member 95e of the heat storage material 95 is smaller than the thermal conductivity of the central member 95f, the heat transfer from the heat storage material 95 to the reaction chamber 1 can be suppressed and, as a result, the heat transfer property from the heat generating element 11 to the heat storage material 95 can be improved.

(2) Since the peripheral member 95e is made of a mixture material of the base material of the heat storage material and the resin beads, and the heat storage material 95 is formed by press forming of the central member 95f and the peripheral member 95e followed by heat treatment, the heat storage material can readily be formed, wherein the thermal conductivity of the peripheral member 95e is smaller than the thermal conductivity of the central member 95f.

(Modified Example of Heat Storage Device)

Figure 7:
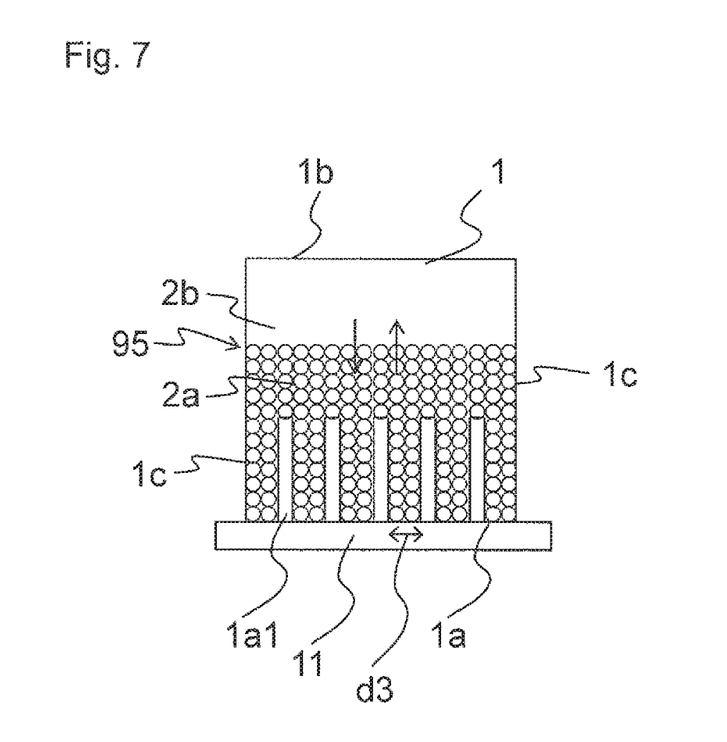
FIG. 7 is a schematic cross-sectional view showing a modified example of the heat storage device.

FIG. 7 is a schematic cross-sectional view showing a modified example of the heat storage device 10. As shown in FIG. 7, the first surface 1a of the reaction chamber 1 has a convexo-concave structure 1a1 formed on an inner surface thereof. The convexo-concave structure 1a1 has, for example, convex portions and/or concave portions that may regularly or randomly be arranged. The convexo-concave structure 1a1 can be formed by any suitable method. The convexo-concave structure 1a1 may be made of a heat conductive material, and can be made of a good conductor of heat such, for example, any one of metals (e.g., copper), oxides (e.g., alumina), nitrides (e.g., aluminum nitride), carbon, and so on. The convexo-concave structure 1a1 may be formed by, for example, dimple formation, wave formation, cutting, molding, or welding of a surface of metal etc. If the convexo-concave structure 1a1 is formed on the first surface 1a, the heat storage material 95 may be in the form of granules so that the heat storage material 95 can readily enter gaps d3 of the convexo-concave structure 1a1. The diameter of the granules is equal to or less than the gaps d3 of the convexo-concave structure 1a1.

According to the above-described configuration, since the reaction chamber 1 has the convexo-concave structure 1a1 on the inner surface of the first surface 1a at a side of (or in the vicinity of, or adjacent to) the heat generating element, a contact area can be increased between the first surface 1a and the heat storage material 95. As a result, the heat transfer property from the heat generating element 11 to the heat storage material 95 can be improved.

Although the heat storage device 10 includes the reaction chamber 1, the condensation/evaporation chamber 3, and the communication part 5 in the above-described embodiment, the heat storage device in some examples may consist of at least one reaction chamber containing the heat storage material without the condensation/evaporation chamber 3 and the communication part 5. In such examples, the heat generated by the heat generating element can be transferred to the heat storage material contained in the reaction chamber and can be absorbed by a reaction into the heat storage material, so that a rise in temperature of the heat generating element can be suppressed.

The electronic apparatus 100 of this embodiment may be utilized with a mobile electronic apparatus such as, for example, a smartphone, a portable telephone, a tablet-type device, a laptop-type personal computer, a portable game console, a portable music player, a digital camera, and so on.

Various modifications and alterations can be made without departing from the spirit and scope of the claims.

INDUSTRIAL APPLICABILITY

The present disclosure can provide an electronic apparatus capable of improving a heat transfer property from a heat generating element to a heat storage material, and therefore has a great industrial utility value.

This application claims priority to and the benefit of Japanese Patent Application No. 2013-244198, filed Nov. 26, 2013, the entire contents of which is incorporated herein by reference.

REFERENCE SIGNS LIST 1 reaction chamber
2a solid phase (including a heat storage material)
2b gas phase (including a condensable component)
3 condensation/evaporation chamber
4a gas phase (including a condensable component)
4b liquid phase (including a condensable component)
5 communication part
6 positioning member
10 heat storage device
11 heat generating element
13 lithium-ion battery
91a metal plate
91b metal plate
93a1 convex part
93a2 convex part
93b concave part
95 heat storage material
96 trap member
97 filter member
100 electronic apparatus

The invention claimed is:

1. An electronic apparatus comprising:
a heat generating element; and
a heat storage device for storing heat generated by the heat generating element,
wherein the heat storage device comprises a reaction chamber containing a heat storage material for absorbing the heat generated by the heat generating element;
the reaction chamber is defined by a first surface, a second surface opposed to the first surface, and a plurality of side surfaces connecting the first surface with the second surface;
in the reaction chamber, a thermal conductivity of a peripheral part is smaller than a thermal conductivity of a central part of the reaction chamber;
a gap is formed between an inner side surface of the reaction chamber and the heat storage material; and
the reaction chamber is provided with a positioning member for positioning the heat storage material.

2. The electronic apparatus according to claim 1, wherein the reaction chamber has a generally rectangular parallelepiped shape defined by the first surface, the second surface, and the plurality of side surfaces,
the heat storage material has a bottom surface located at a side of the first surface of the reaction chamber and has a tapered shape from the bottom surface toward the second surface of the reaction chamber, and
a shape of the bottom surface is generally the same as or smaller than a shape of the first surface of the reaction chamber.

3. The electronic apparatus according to claim 1, wherein the heat storage material has a peripheral member located in the peripheral part and a central member located in the central part, wherein a thermal conductivity of the peripheral member is smaller than a thermal conductivity of the central member.

4. The electronic apparatus according to claim 3, wherein
the peripheral member comprises a mixture material of a base material and resin beads, and
the heat storage material is formed by press forming of the central member and the peripheral member followed by heat treatment.

5. The electronic apparatus according to claim 4, wherein the base material comprises at least one of calcium sulfate, calcium chloride, and zeolite.

6. The electronic apparatus according to claim 4, wherein the peripheral member is formed by a first heat storage material having a doughnut shape and the central member is formed in a center portion of the doughnut shape.

7. The electronic apparatus according to claim 1, wherein the heat storage material comprises a shape that is tapered from the first surface of the reaction chamber to the second surface of the reaction chamber.

* * * * *